(12) United States Patent
Chang et al.

(10) Patent No.: US 10,861,929 B2
(45) Date of Patent: Dec. 8, 2020

(54) ELECTRONIC DEVICE INCLUDING A CAPACITOR

(71) Applicant: TAIWAN SEMICONDUCTOR MANUFACTURING CO., LTD., Hsinchu (TW)

(72) Inventors: Kai-Fung Chang, Taipei (TW); Lien-Yao Tsai, Hsinchu (TW); Baohua Niu, Hsinchu (TW); Yi-Chuan Teng, Zhubei (TW); Chi-Yuan Shih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/163,782

(22) Filed: Oct. 18, 2018

(65) Prior Publication Data
US 2020/0006470 A1 Jan. 2, 2020

Related U.S. Application Data

(60) Provisional application No. 62/690,735, filed on Jun. 27, 2018.

(51) Int. Cl.
*H01L 49/02* (2006.01)
*H01G 4/06* (2006.01)
(Continued)

(52) U.S. Cl.
CPC ............ *H01L 28/75* (2013.01); *B81B 3/0021* (2013.01); *B81B 3/0086* (2013.01); *B81B 7/02* (2013.01); *B81C 1/00134* (2013.01); *H01G 4/06* (2013.01); *H01L 41/047* (2013.01); *B81B 2207/99* (2013.01)

(58) Field of Classification Search
CPC ......... H01L 28/75; H01L 28/40; H01L 28/60; H01L 41/047; H01L 41/08; H01L 25/16; H01G 4/06; H01G 4/4224; H01G 4/012; H01G 2/20; H01G 2/10; B81B 3/0086; B81B 3/0021; B81B 7/02; B81B 7/0022; B81C 1/00134
USPC ....... 257/415, 532, 533, 534, 295, 306, 310, 257/68, E21.008, E21.009, E21.011, 257/E21.021, E21.04, E21.664, E23.002, 257/E27.026, E27.048, E27.104;
(Continued)

(56) References Cited

U.S. PATENT DOCUMENTS 6,201,271 B1 * 3/2001 Okutoh ............... H01L 28/55
257/295
6,509,593 B2 * 1/2003 Inoue ................ H01L 21/76802
257/295
(Continued)

FOREIGN PATENT DOCUMENTS

TW 201338658 A 9/2013

*Primary Examiner* — Dao H Nguyen
(74) *Attorney, Agent, or Firm* — McDermott Will & Emery LLP

(57) ABSTRACT

An electronic device includes a capacitor and a passivation layer covering the capacitor. The capacitor includes a first electrode, a dielectric layer disposed over the first electrode and a second electrode disposed over the dielectric layer. An area of the first electrode is greater than an area of the dielectric layer, and the area of the dielectric layer is greater than an area of the second electrode so that a side of the capacitor has a multi-step structure.

19 Claims, 27 Drawing Sheets

(51) Int. Cl.
  *H01L 41/047* (2006.01)
  *B81B 3/00* (2006.01)
  *B81B 7/02* (2006.01)
  *B81C 1/00* (2006.01)

(58) Field of Classification Search
  USPC ........ 361/303, 304, 309; 438/197, 200, 239, 438/240, 3, 393, 396
  See application file for complete search history.

(56) References Cited

U.S. PATENT DOCUMENTS

| | | | | |
|---|---|---|---|---|
| 6,908,867 B2* | 6/2005 | Yokota | ................ | H01L 21/3144 438/781 |
| 6,982,448 B2* | 1/2006 | Udayakumar | .... | H01L 27/11507 257/295 |
| 7,456,454 B2* | 11/2008 | Sashida | ............... | H01L 21/7687 257/295 |
| 7,547,933 B2* | 6/2009 | Takamatsu | ........ | H01L 21/31691 257/295 |
| 7,846,808 B2* | 12/2010 | Hwang | ............. | H01L 21/31116 257/E21.647 |
| 8,067,817 B2* | 11/2011 | Wang | ................ | H01L 27/11507 257/295 |
| 8,093,070 B2* | 1/2012 | Celii | ................. | H01L 27/11507 257/E21.664 |
| 8,274,152 B2* | 9/2012 | Nagai | ............... | H01L 21/76834 257/295 |
| 8,445,991 B2* | 5/2013 | Cho | .................. | H01L 21/31144 257/532 |
| 8,629,488 B2* | 1/2014 | Hose | ....................... | H01L 28/75 |
| 2003/0006439 A1* | 1/2003 | Bailey | ................ | H01L 27/11502 257/295 |
| 2003/0089954 A1* | 5/2003 | Sashida | ............... | H01L 21/7687 257/369 |
| 2005/0127395 A1* | 6/2005 | Saigoh | .................. | H01L 23/564 257/127 |
| 2005/0136554 A1* | 6/2005 | Okita | ...................... | H01L 28/57 438/3 |
| 2005/0285173 A1* | 12/2005 | Nagai | ............... | H01L 21/02063 257/296 |
| 2006/0134808 A1* | 6/2006 | Summerfelt | ............ | H01L 28/57 |
| 2009/0068763 A1* | 3/2009 | Noda | ................ | H01L 27/11507 438/3 |
| 2011/0193194 A1 | 8/2011 | Takahashi et al. | | |

* cited by examiner

ELECTRONIC DEVICE INCLUDING A CAPACITOR

RELATED APPLICATION

This application claims priority of U.S. Provisional Patent Application No. 62/690,735 filed on Jun. 27, 2018, the entire contents of which are incorporated herein by reference.

BACKGROUND

Piezo-electric devices, such as a MEMS device and a piezo-actuator have recently been developed. Some of the piezo-electric devices include an integrated capacitor provided thereto. Further, many semiconductor devices also include an integrated capacitor. Generally, a capacitance structure has the highest electric field at the edge, and thus breakdown may easily occur at the edge. For example, the edge of the capacitor may have a high leakage current due to the high electrical field. Accordingly, it is generally desirable to reduce such a high electrical field at the edge of the capacitor to prevent breakdown.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
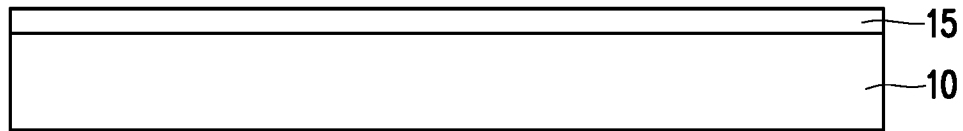
FIG. 1A shows one of the various stages of a manufacturing operation for an electronic device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, at least one of A, B and C means "A," "B," "C," "A and B," "A and C," "B and C," or "A, B and C," and does not mean that one from A, one from B and one from C, unless otherwise indicated.

A capacitor formed over a substrate of a semiconductor device or a piezo electric device includes a bottom electrode, an upper electrode and a dielectric layer disposed between the bottom electrode and the upper electrode, which are vertically (perpendicular to the surface of the substrate) stacked. In such a stacked capacitor, when the upper electrode has a smaller area than the dielectric layer, the edge of the upper electrode may cause a local concentration of electric field, which in turn may cause a dielectric breakdown of the dielectric layer.

In the present disclosure, various capacitor structures that can reduce the local concentration of electric field will be provided.

FIGS. 1A-1G show various stages of a manufacturing operation for an electronic device including a capacitor according to an embodiment of the present disclosure. It is understood that additional operations can be provided before, during, and after the processes shown by FIGS. 1A-1G, and some of the operations described below can be replaced or eliminated, for additional embodiments of the method. The order of the operations/processes may be interchangeable.

In the embodiment shown by FIGS. 1A-1G, an electronic device includes a capacitor that includes a first electrode 20 (e.g., a bottom electrode), a capacitor dielectric layer 22 disposed over the first electrode 20, and a second electrode 24 (e.g., an upper electrode) disposed over the capacitor dielectric layer 22. The capacitor is covered by a passivation layer 30. An area of the first electrode 20 is greater than an area of the capacitor dielectric layer 22, and the area of the capacitor dielectric layer 22 is greater than an area of the second electrode 24 so that a side of the capacitor has a multi-step structure (see, FIG. 1G). A conductive layer 40 is further disposed over the passivation layer 30, and the conductive layer 40 is electrically floating.

As shown in FIG. 1A, an insulating layer 15 is formed over a substrate 10. In some embodiments, the substrate 10 is a semiconductor substrate. In some embodiments, the substrate 10 is made of a suitable elemental semiconductor, such as silicon, diamond or germanium; a suitable alloy or compound semiconductor, such as Group IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure. In certain embodiments, a Si substrate is used. In other embodiments, the substrate 10 is made of a ceramic material, a metal material or an organic material.

The insulating layer 15 includes one or more layers of silicon oxide, silicon nitride, titanium oxide, aluminum oxide or any other suitable insulating materials. In some embodiments, the thickness of the insulating layer 15 is in a range from about 0.1 μm to about 5.0 μm, and is in a range from about 1.0 μm to about 3.0 μm in other embodiments. The insulating layer 15 can be formed by chemical vapor deposition (CVD), atomic layer deposition (ALD), or physical vapor deposition (PVD) including sputtering, or any other suitable film formation methods.

Figure 1B:
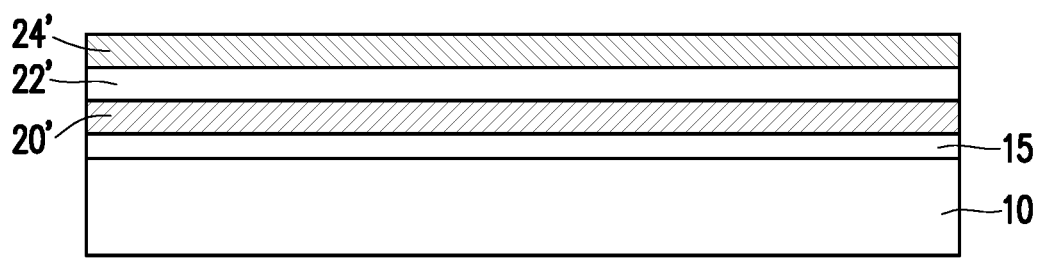
FIG. 1B shows one of the various stages of a manufacturing operation for an electronic device according to an embodiment of the present disclosure.

As shown in FIG. 1B, a first conductive layer 20' for the first electrode 20 is formed over the insulating layer 15, a dielectric layer 22' for the capacitor dielectric layer 22 is formed over the first conductive layer 20' and a second conductive layer 24' is formed over the dielectric layer 22'. The first conductive layer 20' includes one or more of platinum, ruthenium, gold, copper, aluminum, an aluminum-copper alloy, tungsten, nickel or molybdenum, or any other suitable conductive materials. The second conductive layer 24' also includes one or more of platinum, ruthenium, gold, copper, aluminum, an aluminum-copper alloy, tungsten, nickel or molybdenum, or any other suitable conductive materials. In some embodiments, the material of the first conductive layer 20' is the same as or different from the material of the second conductive layer 24'. In some embodiments, the thickness of the first and/or second conductive layers is in a range from about 10 nm to about 1.0 µm, and is in a range from about 50 nm to about 600 nm in other embodiments. The first and/or second conductive layers can be formed by chemical vapor deposition (CVD), atomic layer deposition (ALD), physical vapor deposition (PVD) including sputtering, or electroplating, or any other suitable film formation methods.

The dielectric layer 22' includes one or more layers of silicon oxide, silicon nitride, titanium oxide, aluminum oxide, aluminum nitride, or any other suitable insulating materials. In some embodiments, the dielectric layer 22' includes one or more layers of ferroelectric dielectric material layers. For example, the dielectric layer 22' includes one or more materials selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), and $Ta_2O_5$. In some embodiments, $HfO_2$ doped with Si, Al and/or Zr or $ZrO_2$ doped with Si and/or Al is used as the dielectric layer 22'. In other embodiments, an organic material, such as a polymer (e.g., polyethylene terephthalate) is used.

In some embodiments, the thickness of the dielectric layer 22' is in a range from about 0.2 µm to about 2.0 µm, and is in a range from about 0.5 µm to 1.0 µm in other embodiments. The dielectric layer 22' can be formed by chemical vapor deposition (CVD), atomic layer deposition (ALD), or physical vapor deposition (PVD) including sputtering, or any other suitable film formation methods.

Figure 1C:
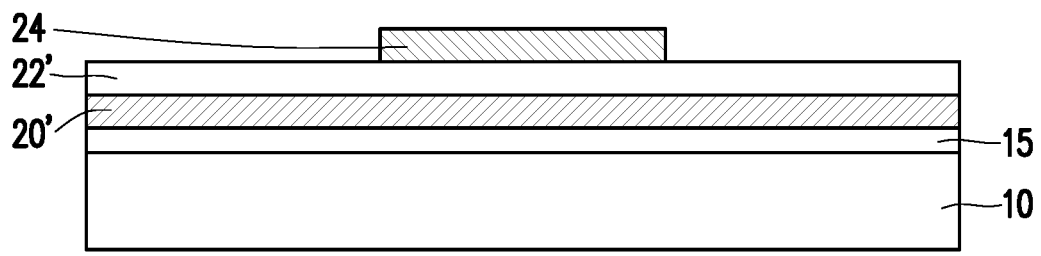
FIG. 1C shows one of the various stages of a manufacturing operation for an electronic device according to an embodiment of the present disclosure.

Then, as shown in FIG. 1C, the second conductive layer 24' is patterned to obtain the second electrode 24, by using one or more lithography and etching operations.

Figure 1D:
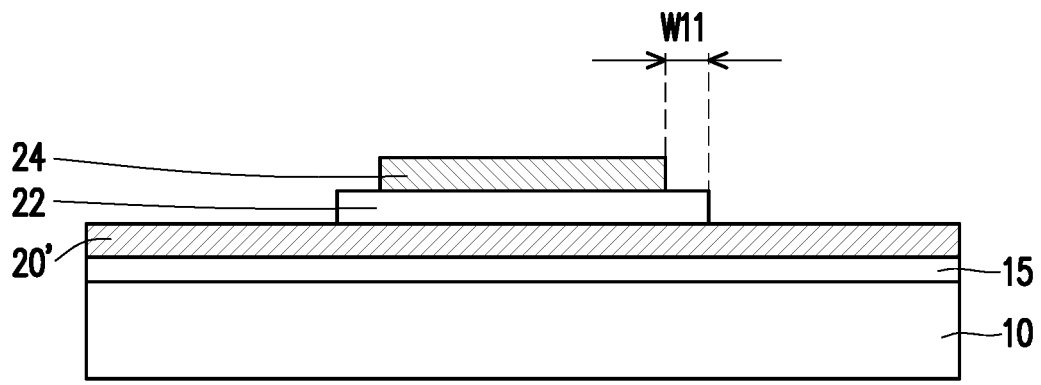
FIG. 1D shows one of the various stages of a manufacturing operation for an electronic device according to an embodiment of the present disclosure.

Further, as shown in FIG. 1D, the dielectric layer 22' is patterned to obtain the capacitor dielectric layer 22, by using one or more lithography and etching operations. As shown in FIG. 1D, the dielectric layer 22' is patterned such that the peripheral portion of the capacitor dielectric layer 22 is not covered by the second electrode 24 and is exposed. The width W11 of the exposed peripheral portion of the capacitor dielectric layer 22 is in a range from about 10 nm to about 1.0 µm, and is in a range from about 50 nm to 500 nm in other embodiments.

Figure 1E:
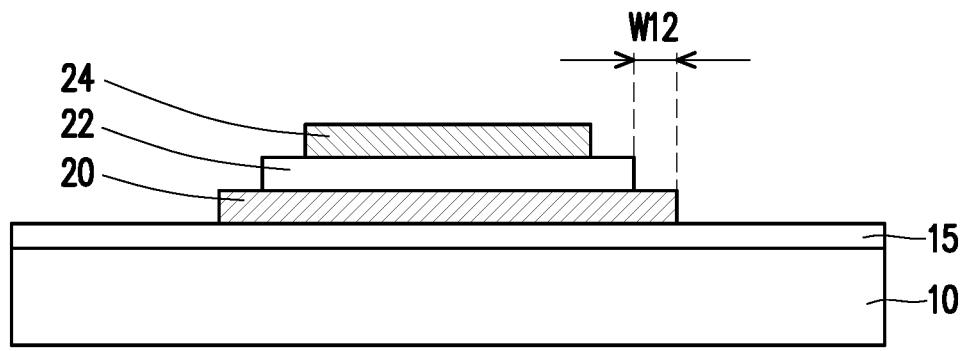
FIG. 1E shows one of the various stages of a manufacturing operation for an electronic device according to an embodiment of the present disclosure.

Then, as shown in FIG. 1E, the first conductive layer 20' is patterned to obtain the first electrode 20, by using one or more lithography and etching operations. As shown in FIG. 1E, the first conductive layer 20' is patterned such that the peripheral portion of the first electrode 20 is not covered by the capacitor dielectric layer 22 and is exposed. The width W12 of the exposed peripheral portion of the first electrode 20 is in a range from about 10 nm to about 1.0 µm, and is in a range from about 50 nm to 500 nm in other embodiments. As shown in FIG. 1E, the capacitor has a multi-step structure formed by the first electrode and the capacitor dielectric layer and by the capacitor dielectric layer and the second electrode.

Figure 1F:
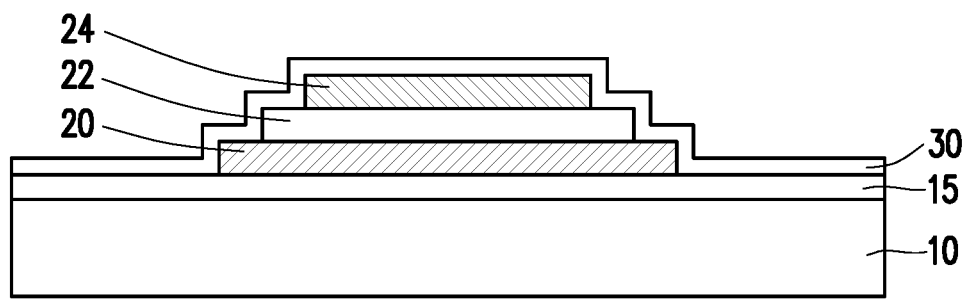
FIG. 1F shows one of the various stages of a manufacturing operation for an electronic device according to an embodiment of the present disclosure.

Subsequently, a passivation layer 30 is formed to cover the capacitor including the second electrode 24, the capacitor dielectric layer 22 and the first electrode 20, as shown in FIG. 1F. The passivation layer 30 includes one or more layers of silicon oxide, silicon nitride or, aluminum oxide or any other suitable insulating materials. In some embodiments, the thickness of the passivation layer 30 is in a range from about 0.02 µm to about 2.0 µm, and is in a range from about 0.1 µm to about 1.0 µm in other embodiments. In some embodiments, the passivation layer 30 is made of the same as or a different material than the capacitor dielectric layer 22. The passivation layer 30 can be formed by chemical vapor deposition (CVD), atomic layer deposition (ALD), or physical vapor deposition (PVD) including sputtering, or any other suitable film formation methods. In some embodiments, the passivation layer 30 has a higher dielectric constant than the capacitor dielectric layer 22.

Figure 1G:
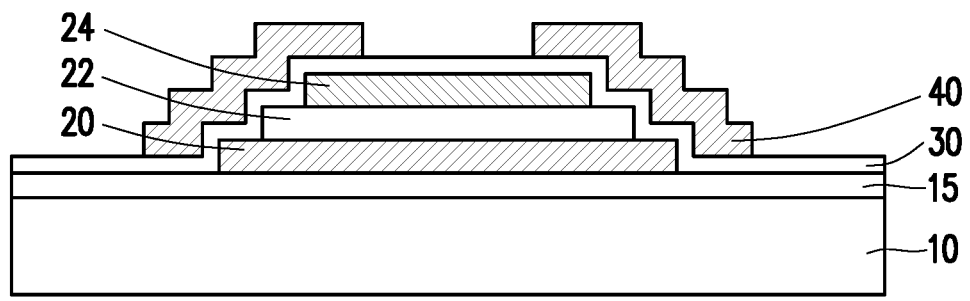
FIG. 1G shows a cross sectional view of an electronic device according to an embodiment of the present disclosure.

Further, as shown in FIG. 1G, a third conductive layer 40 is formed over the passivation layer 30. The third conductive layer 40 can be formed by one or more film formation operations and one or more lithography and etching operations. The third conductive layer 40 is electrically floating. In some embodiments, as shown in FIG. 1G, the third conductive layer 40 covers at least the step structure formed by the capacitor dielectric layer 22 and an edge part of the second electrode 24, and does not cover a part of the passivation layer 30 disposed above the second electrode 24. In other embodiments, the third conductive layer 40 covers at least the side of the capacitor having the multi-step structure and an edge part of the second electrode 24, and does not cover a part of the passivation layer 30 disposed above the second electrode 24.

Figure 1H:
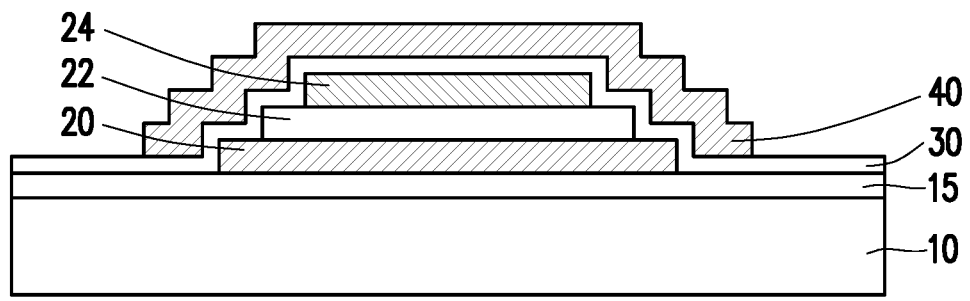
FIG. 1H shows a cross sectional view of an electronic device according to an embodiment of the present disclosure.

In other embodiments, as shown in FIG. 1H, the third conductive layer 40 fully covers the capacitor.

The third conductive layer 40 includes one or more of platinum, ruthenium, gold, copper, aluminum, an aluminum-copper alloy, titanium, tantalum, tungsten, nickel or molybdenum, or any other suitable conductive materials. In some embodiments, the material of the third conductive layer 40 is the same as or different from the material of the first and/or second electrodes 20, 24. In some embodiments, the thickness of the third conductive layers 40 is in a range from about 10 nm to about 5.0 µm, and is in a range from about 100 nm to about 1.0 µm in other embodiments. The third conductive layer 40 can be formed by chemical vapor deposition (CVD), atomic layer deposition (ALD), physical vapor deposition (PVD) including sputtering, or electroplating, or any other suitable film formation methods.

In the structure shown in FIGS. 1G and 1H, due to the floating third conductive layer 40, a coupling reverse electric filed is induced, and the electric field at the edge of the second electrode 24 and/or the edge of the first electrode 20 can be reduced by the coupling reverse electric field, compared with the structure that does not include a floating electrode.

FIGS. 2A-2G show various stages of a manufacturing operation for an electronic device including a capacitor according to another embodiment of the present disclosure. It is understood that additional operations can be provided before, during, and after the processes shown by FIGS. 2A-2G, and some of the operations described below can be replaced or eliminated, for additional embodiments of the method. The order of the operations/processes may be interchangeable. Materials, structures, configurations, dimensions and/or processes the same as or similar to the foregoing embodiments described with FIGS. 1A-1H may be employed in the following embodiments, and detailed explanation thereof may be omitted.

Figure 2A:
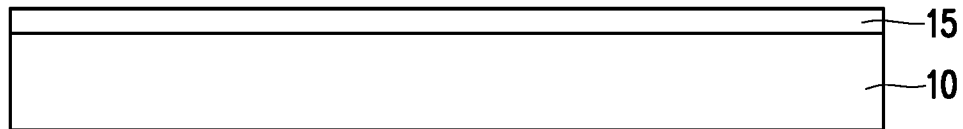
FIG. 2A shows one of the various stages of a manufacturing operation for an electronic device according to an embodiment of the present disclosure.

As shown in FIG. 2A, an insulating layer 15 is formed over a substrate 10, similar to FIG. 1A.

Figure 2B:
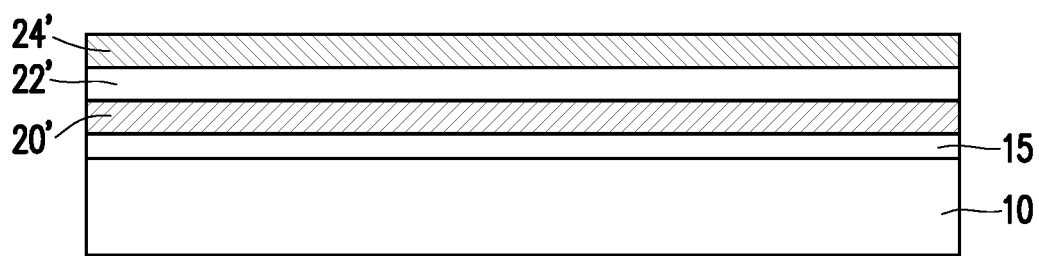
FIG. 2B shows one of the various stages of a manufacturing operation for an electronic device according to an embodiment of the present disclosure.

As shown in FIG. 2B, a first conductive layer 20' for the first electrode 20 is formed over the insulating layer 15, a dielectric layer 22' for the capacitor dielectric layer 22 is formed over the first conductive layer 20' and a second conductive layer 24' is formed over the dielectric layer 22', similar to FIG. 1B.

Figure 2C:
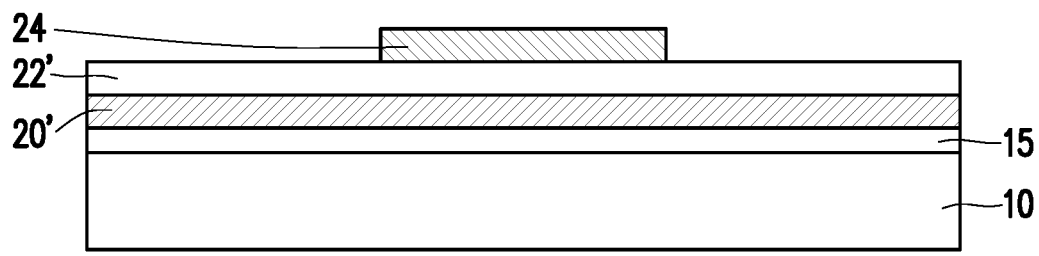
FIG. 2C shows one of the various stages of a manufacturing operation for an electronic device according to an embodiment of the present disclosure.
Figure 2D:
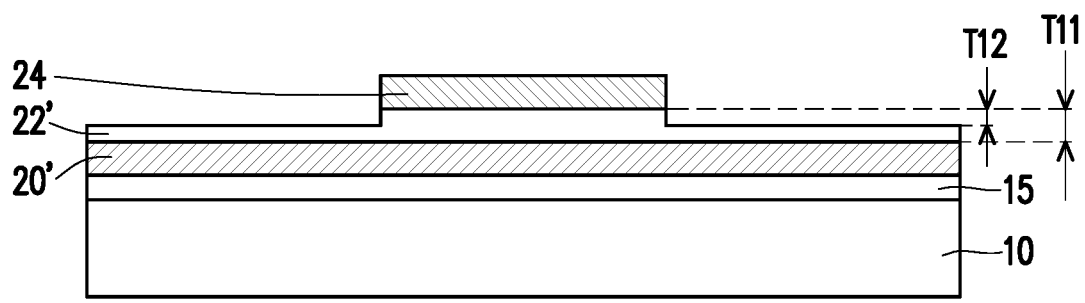
FIG. 2D shows one of the various stages of a manufacturing operation for an electronic device according to an embodiment of the present disclosure.

Then, as shown in FIG. 2C, the second conductive layer 24' is patterned to obtain the second electrode 24, by using one or more lithography and etching operations, similar to FIG. 1C. In the etching of the second conductive layer 24', an over-etching is performed to partially etch the dielectric layer 22', as shown in FIG. 2D. In some embodiments, the over-etched amount T12 is in a range from about 10% to about 80% of the thickness T11 of the dielectric layer 22', and is in a range from about 20% to about 60% of the thickness T11 of the dielectric layer 22' in other embodiments. In certain embodiments, the over-etched amount T12 is in a range from about 0.1 µm to about 1.5 µm, and is in a range from about 0.5 µm to 1.0 µm in other embodiments.

Figure 2E:
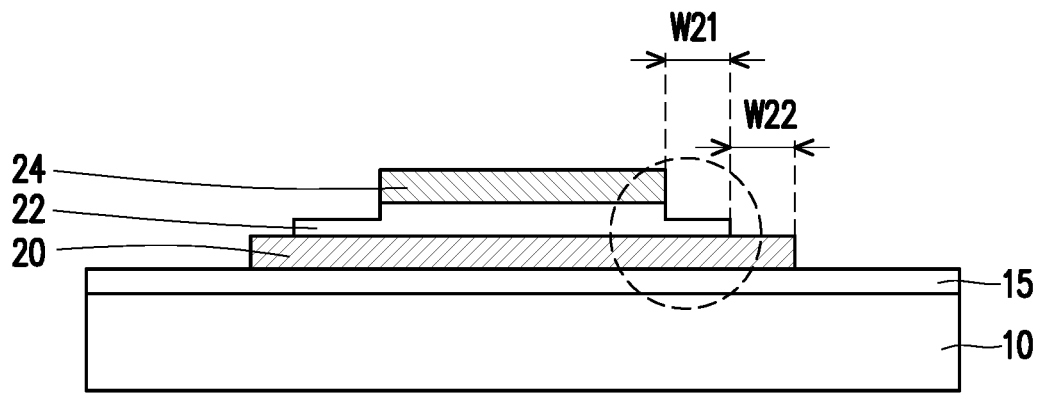
FIG. 2E shows one of the various stages of a manufacturing operation for an electronic device according to an embodiment of the present disclosure.

Further, as shown in FIG. 2E, the partially etched dielectric layer 22' is patterned to obtain the capacitor dielectric layer 22, by using one or more lithography and etching operations, and the first conductive layer 20' is patterned to obtain the first electrode 20, by using one or more lithography and etching operations, similar to FIGS. 1D and 1E. As shown in FIG. 2E, the dielectric layer 22' is patterned such that the peripheral portion of the capacitor dielectric layer 22 is not covered by the second electrode 24 and is exposed. The width W21 of the exposed peripheral portion of the capacitor dielectric layer 22 is in a range from about 10 nm to about 1.0 µm, and is in a range from about 50 nm to 500 nm in other embodiments. The first conductive layer 20' is patterned such that the peripheral portion of the first electrode 20 is not covered by the capacitor dielectric layer 22 and is exposed. The width W22 of the exposed peripheral portion of the first electrode 20 is in a range from about 10 nm to about 1.0 µm, and is in a range from about 50 nm to 500 nm in other embodiments.

Figure 2F:
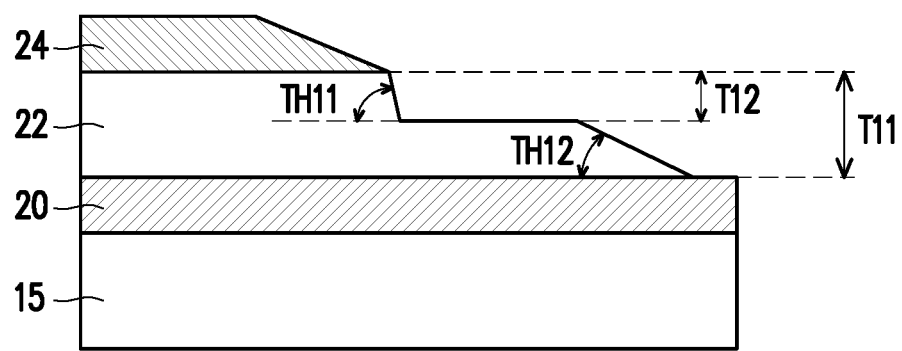
FIG. 2F shows an enlarged view of FIG. 2E.

As shown in FIG. 2F, which is an enlarged view of the circled portion of FIG. 2E, the capacitor has a multi-step structure formed by the first electrode 20 and the capacitor dielectric layer 22 and by the capacitor dielectric layer 22 and the second electrode 24, and further including a step in the capacitor dielectric layer 22. In some embodiments, the capacitor dielectric layer 22 includes two or more steps in the side face.

In some embodiments, the uppermost part (step) of the capacitor dielectric layer 22 has a tapered shape as shown in FIG. 2F. In some embodiments, the angle TH11 of the tapered shape is in a range from about 60° to about 90° and is in a range from about 70° to 85° in other embodiments. Further, in some embodiments, the lowermost part (step) of the capacitor dielectric layer 22 also has a tapered shape, and the angle TH12 of the tapered shape is in a range from about 10° to about 50° and is in a range from about 20° to 40° in other embodiments.

Figure 2G:
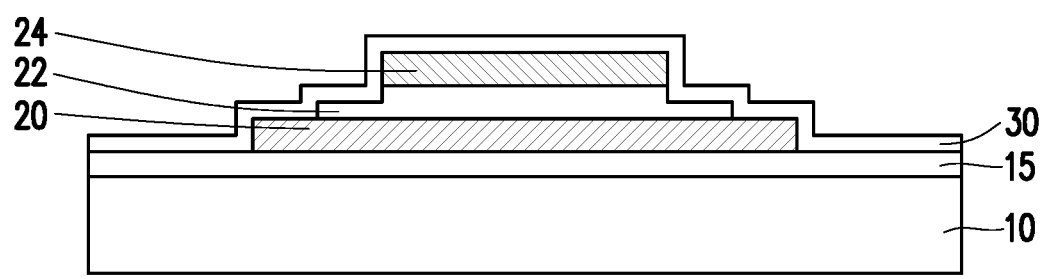
FIG. 2G shows one of the various stages of a manufacturing operation for an electronic device according to an embodiment of the present disclosure.

Subsequently, as shown in FIG. 2G, a passivation layer 30 is formed to cover the capacitor including the second electrode 24, the capacitor dielectric layer 22 and the first electrode 20, similar to FIG. 1F.

In the structure shown in FIG. 2G, the over etching of the dielectric layer 22' creates a more exposed side face in the capacitor dielectric layer 22, and this structure can reduce the electric field at the edge of the second electrode 24 and/or the edge of the first electrode 20.

FIGS. 3A-3H show various stages of a manufacturing operation for an electronic device including a capacitor according to another embodiment of the present disclosure. It is understood that additional operations can be provided before, during, and after the processes shown by FIGS. 3A-3H, and some of the operations described below can be replaced or eliminated, for additional embodiments of the method. The order of the operations/processes may be interchangeable. Materials, structures, configurations, dimensions and/or processes the same as or similar to the foregoing embodiments described with FIGS. 1A-2G may be employed in the following embodiments, and detailed explanation thereof may be omitted.

Figure 3A:
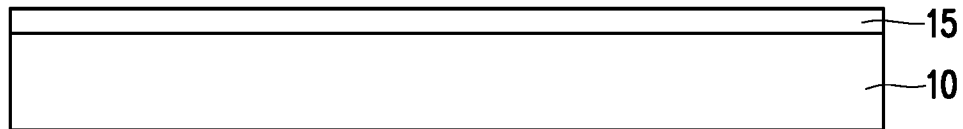
FIG. 3A shows one of the various stages of a manufacturing operation for an electronic device according to an embodiment of the present disclosure.

As shown in FIG. 3A, an insulating layer 15 is formed over a substrate 10, similar to FIG. 1A.

Figure 3B:
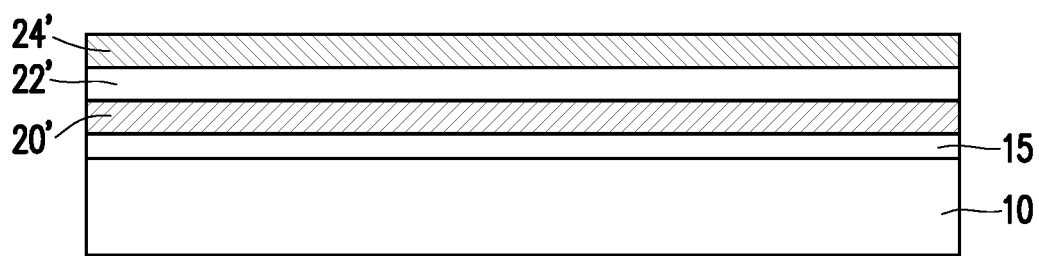
FIG. 3B shows one of the various stages of a manufacturing operation for an electronic device according to an embodiment of the present disclosure.

As shown in FIG. 3B, a first conductive layer 20' for the first electrode 20 is formed over the insulating layer 15, a dielectric layer 22' for the capacitor dielectric layer 22 is formed over the first conductive layer 20' and a second conductive layer 24' is formed over the dielectric layer 22', similar to FIG. 1B.

Figure 3C:
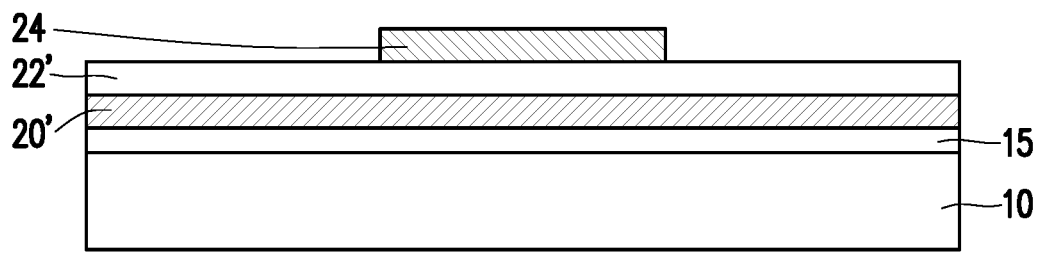
FIG. 3C shows one of the various stages of a manufacturing operation for an electronic device according to an embodiment of the present disclosure.

Then, as shown in FIG. 3C, the second conductive layer 24' is patterned to obtain the second electrode 24, by using one or more lithography and etching operations, similar to FIG. 1C.

Figure 3D:
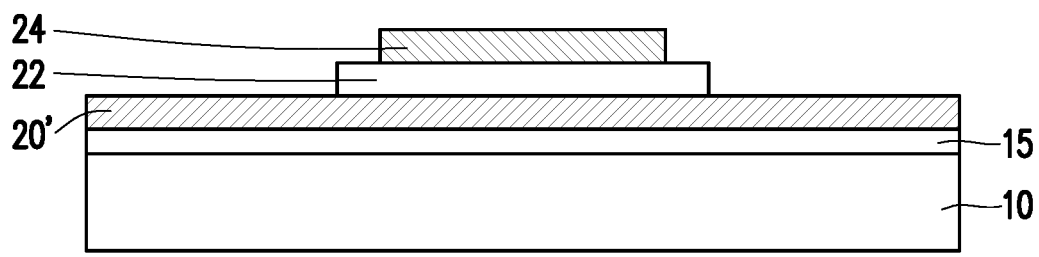
FIG. 3D shows one of the various stages of a manufacturing operation for an electronic device according to an embodiment of the present disclosure.

Further, as shown in FIG. 3D, the dielectric layer 22' is patterned to obtain the capacitor dielectric layer 22, by using one or more lithography and etching operations, similar to FIG. 1D.

Figure 3E:
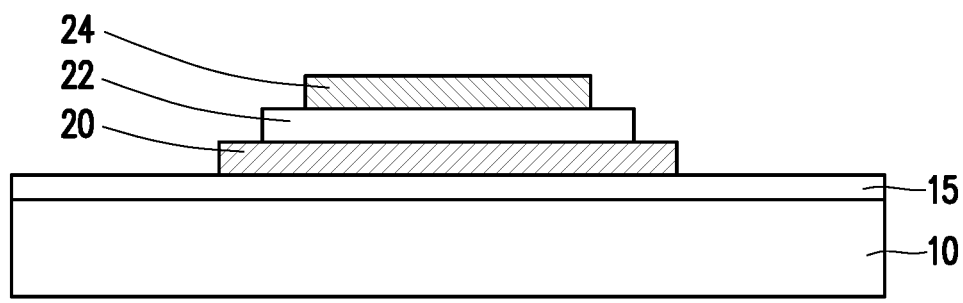
FIG. 3E shows one of the various stages of a manufacturing operation for an electronic device according to an embodiment of the present disclosure.

Then, as shown in FIG. 3E, the first conductive layer 20' is patterned to obtain the first electrode 20, by using one or more lithography and etching operations, similar to FIG. 1E.

Figure 3F:
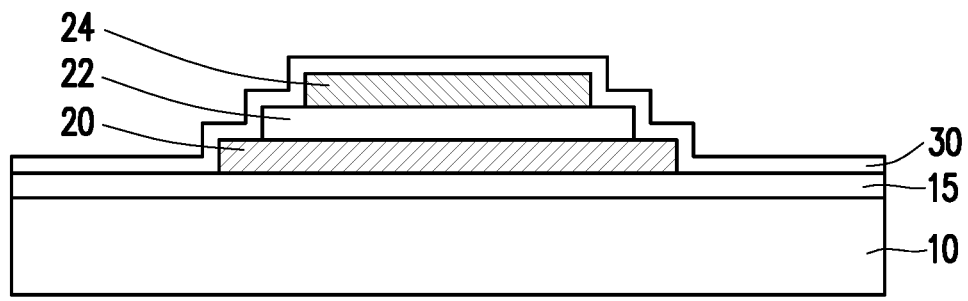
FIG. 3F shows one of the various stages of a manufacturing operation for an electronic device according to an embodiment of the present disclosure.

Subsequently, as shown in FIG. 3F, a passivation layer 30 is formed to cover the capacitor including the second electrode 24, the capacitor dielectric layer 22 and the first electrode 20, similar to FIG. 1F. In some embodiments, the passivation layer 30 has a higher dielectric constant than the capacitor dielectric layer 22.

Figure 3G:
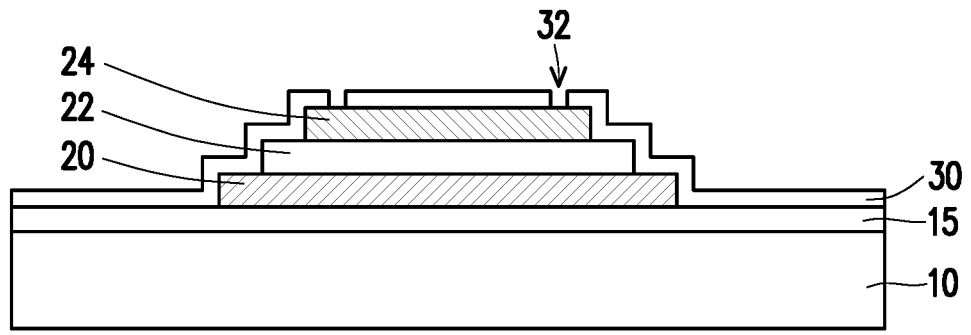
FIG. 3G shows one of the various stages of a manufacturing operation for an electronic device according to an embodiment of the present disclosure.

Next, as shown in FIG. 3G, one or more openings 32 are formed in the passivation layer 30, by using one or more lithography and etching operations, so as to partially expose the upper surface of the second electrode 24.

Figure 3H:
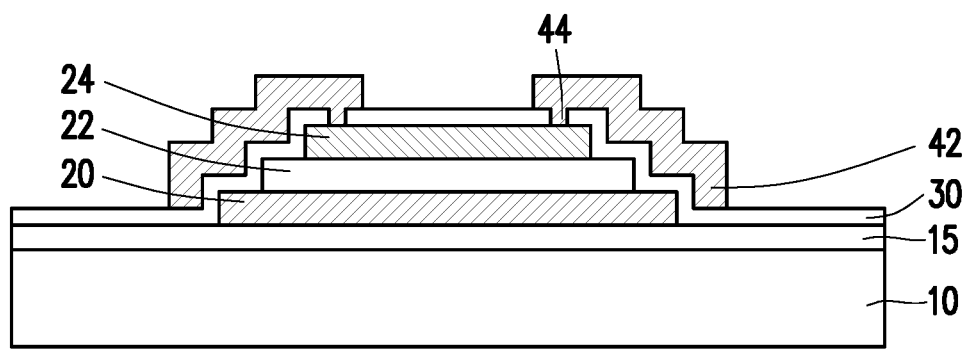
FIG. 3H shows one of the various stages of a manufacturing operation for an electronic device according to an embodiment of the present disclosure.

Further, as shown in FIG. 3H, a third conductive layer 42 is formed over the passivation layer 30, similar to FIG. 1G. As shown in FIG. 3H, the conductive material for the third conductive layer 42 also fills the one or more openings 32 to form one or more conductive connectors 44 such that the third conductive layer 42 is electrically connected to the second electrode 24 via the one or more conductive connectors 44. The materials, dimensions and/or formation methods of the third conductive layer 42 is the same as or similar to those of the third conductive layer 40.

FIG. 3H shows that the third conductive layer 42 covers at least the step structure formed by the capacitor dielectric layer 22 and the second electrode 24 and an edge part of the second electrode 24, and does not cover a part of the passivation layer 30 disposed above the second electrode 24. In other embodiments, similar to FIG. 1H, the third conductive layer 42 fully covers the capacitor.

In the structure shown in FIG. 3H, due to the third conductive layer 42 connected to the second electrode 24 together with a higher dielectric constant of the passivation layer 30, the electric field at the edge of the second electrode 24 and/or the edge of the first electrode 20 can be reduced.

FIGS. 4A-4I show various stages of a manufacturing operation for an electronic device including a capacitor according to another embodiment of the present disclosure. It is understood that additional operations can be provided before, during, and after the processes shown by FIGS. 4A-4I, and some of the operations described below can be replaced or eliminated, for additional embodiments of the method. The order of the operations/processes may be interchangeable. Materials, structures, configurations, dimensions and/or processes the same as or similar to the foregoing embodiments described with FIGS. 1A-3H may be employed in the following embodiments, and detailed explanation thereof may be omitted.

Figure 4A:
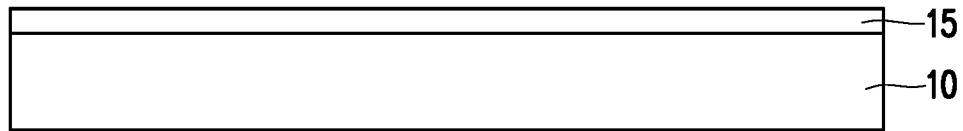
FIG. 4A shows one of the various stages of a manufacturing operation for an electronic device according to an embodiment of the present disclosure.

As shown in FIG. 4A, an insulating layer 15 is formed over a substrate 10, similar to FIG. 1A.

Figure 4B:
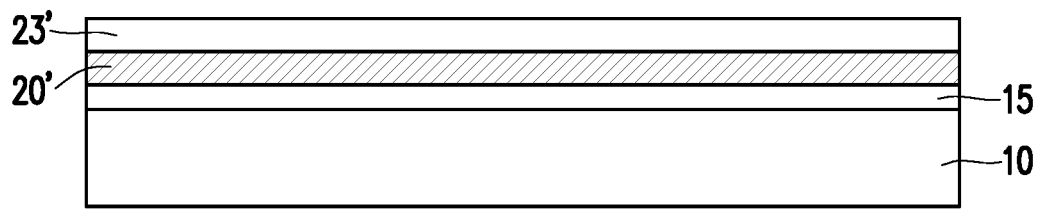
FIG. 4B shows one of the various stages of a manufacturing operation for an electronic device according to an embodiment of the present disclosure.

As shown in FIG. 4B, a first conductive layer 20' for the first electrode 20 is formed over the insulating layer 15, and a first dielectric layer 23' for the capacitor dielectric layer 22 is formed over the first conductive layer 20'.

Figure 4C:
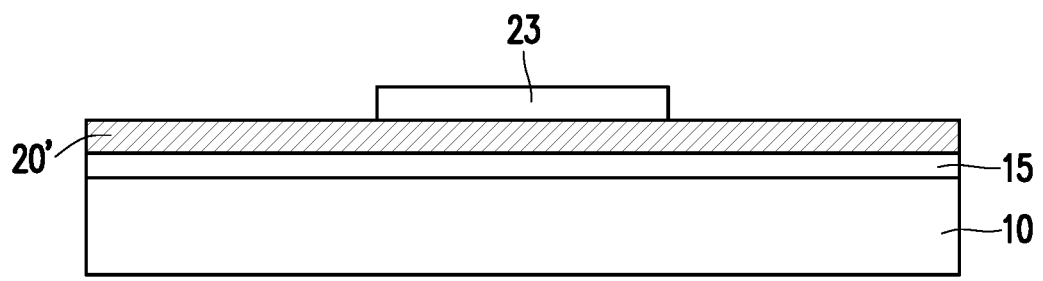
FIG. 4C shows one of the various stages of a manufacturing operation for an electronic device according to an embodiment of the present disclosure.

Then, as shown in FIG. 4C, the first dielectric layer 23' is patterned to obtain a first dielectric part 23 of the capacitor dielectric layer 22, by using one or more lithography and etching operations. The materials, dimensions and/or formation methods of the first dielectric layer 23' is the same as or similar to those of the dielectric layer 22.

Figure 4D:
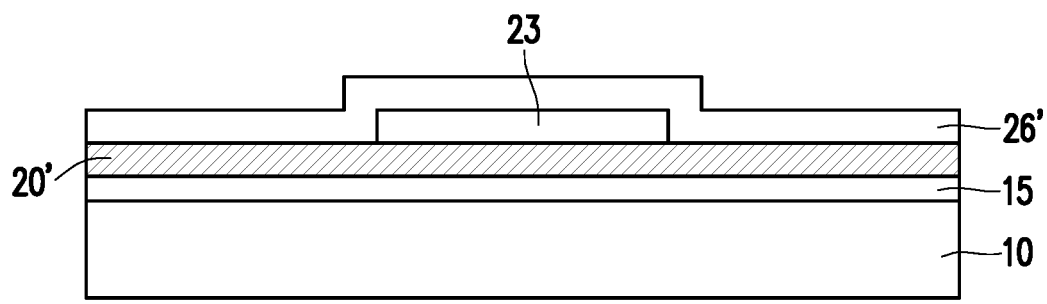
FIG. 4D shows one of the various stages of a manufacturing operation for an electronic device according to an embodiment of the present disclosure.

Further, as shown in FIG. 4D, a second dielectric layer 26' is formed over the patterned first dielectric part 23 and the first conductive layer 20'.

The second dielectric layer 26' has a higher breakdown voltage (BD) than the first dielectric layer 23' (the first dielectric part 23) in some embodiments. In some embodiments, the second dielectric layer includes one or more layers of silicon oxide (BD~5 MV/cm), silicon nitride (BD~6 MV/cm), titanium oxide (BD~1 MV/cm), polycrystalline diamond (BD~10 MV/cm), aluminum oxide (BD~100 kV/cm), amorphous carbon, PZT (BD~200 kV/cm), or any other suitable insulating materials. For example, when the first dielectric layer 23' is made of PZT (BD~200 kV/cm) or aluminum oxide (BD~100 kV/cm), the second dielectric layer 26' can be made of silicon oxide (BD~5 MV/cm), silicon nitride (BD~6 MV/cm), titanium oxide (BD~1 MV/cm), or polycrystalline diamond (BD~10 MV/cm).

Figure 4E:
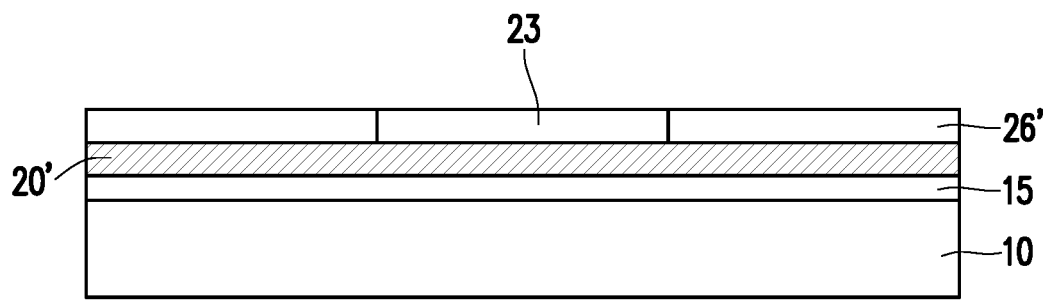
FIG. 4E shows one of the various stages of a manufacturing operation for an electronic device according to an embodiment of the present disclosure.

Then, a planarization operation, such as an etch-back process or a chemical mechanical polishing (CMP) process, is performed to planarize the dielectric layers by removing a part of the second dielectric layer 26' above the first dielectric part 23, as shown in FIG. 4E. After the planarization operation, the thickness of the first and second dielectric parts is in a range from about 0.2 µm to about 2.0 µm, and is in a range from about 0.5 µm to 1.0 µm in other embodiments.

Figure 4F:
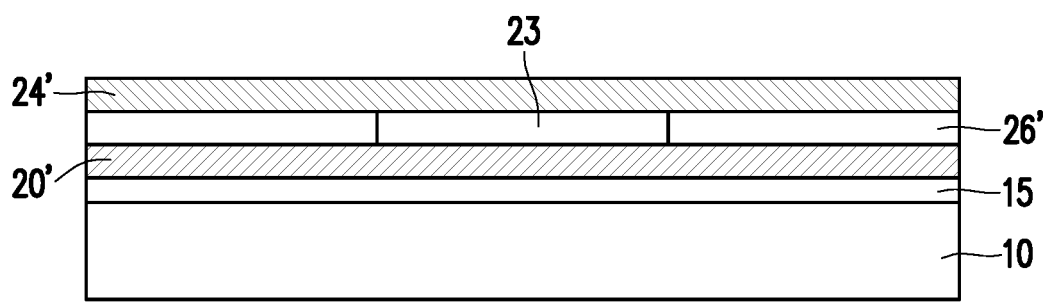
FIG. 4F shows one of the various stages of a manufacturing operation for an electronic device according to an embodiment of the present disclosure.

Next, as shown in FIG. 4F, a second conductive layer 24' is formed.

Figure 4G:
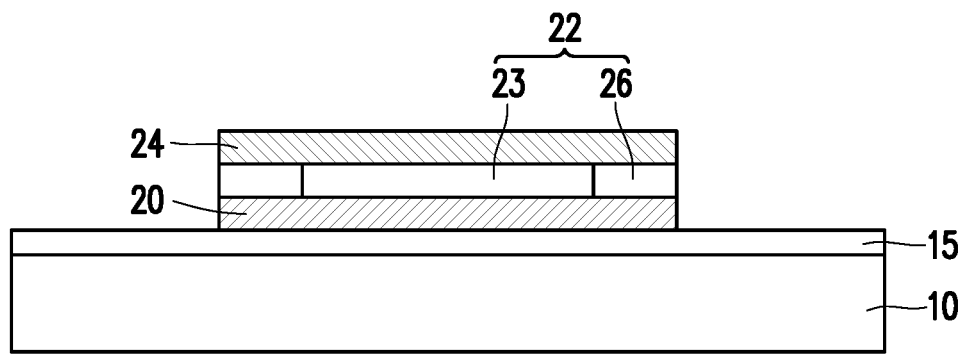
FIG. 4G shows one of the various stages of a manufacturing operation for an electronic device according to an embodiment of the present disclosure.
Figure 4H:
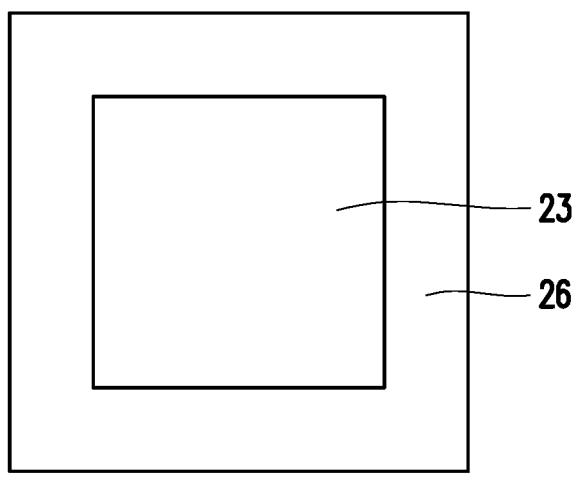
FIG. 4H shows a plan view of a capacitor dielectric layer.

Then, as shown in FIG. 4G, the second conductive layer 24, the second dielectric layer 26' and the first conductive layer 20' are patterned by one or more lithography and etching operations. As seen from above, looking through the second conductive layer 24, as shown in FIG. 4H, the second dielectric part 26 surrounds the first dielectric part 23.

Figure 4I:
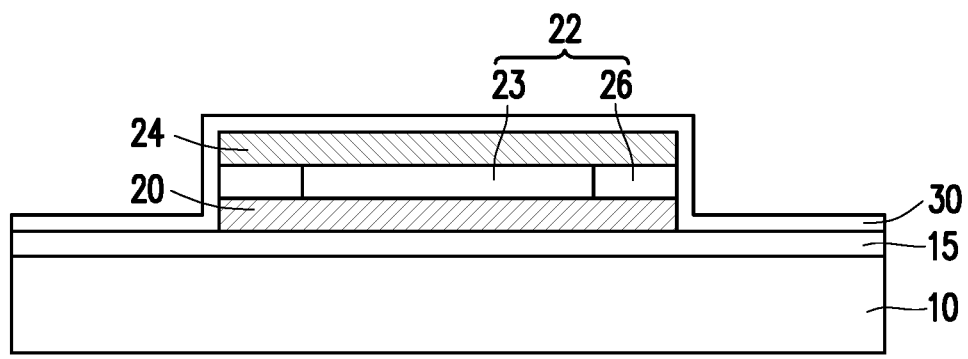
FIG. 4I shows one of the various stages of a manufacturing operation for an electronic device according to an embodiment of the present disclosure.

Subsequently, as shown in FIG. 4I, a passivation layer 30 is formed to cover the capacitor including the second electrode 24, the capacitor dielectric layer 22 having the first dielectric part 23 and the second dielectric part 26, and the first electrode 20, similar to FIG. 1F.

In the structure shown in FIG. 4I, due to the second dielectric part 26 having a higher breakdown voltage, it is possible to prevent dielectric breakdown at the edge of the second electrode 24. In FIG. 4I, the edge of the second electrode 24 and the edge of the second dielectric part 26 are flush with each other in some embodiments. In other embodiments, the edge of the second electrode is located above the second dielectric part 26, but is not located above the first dielectric part 23. When the edge of the second electrode 24 is located above the second dielectric part 26, it is possible to prevent dielectric breakdown at the edge of the second electrode 24.

FIGS. 5A-5G show various stages of a manufacturing operation for an electronic device including a capacitor according to another embodiment of the present disclosure. It is understood that additional operations can be provided before, during, and after the processes shown by FIGS. 5A-5G, and some of the operations described below can be replaced or eliminated, for additional embodiments of the method. The order of the operations/processes may be interchangeable. Materials, structures, configurations, dimensions and/or processes the same as or similar to the foregoing embodiments described with FIGS. 1A-4I may be employed in the following embodiments, and detailed explanation thereof may be omitted.

In this embodiment, a barrier layer is formed on the second electrode (second conductive layer) before patterning the second electrode to avoid process defect penetration into the capacitor dielectric layer.

Figure 5A:
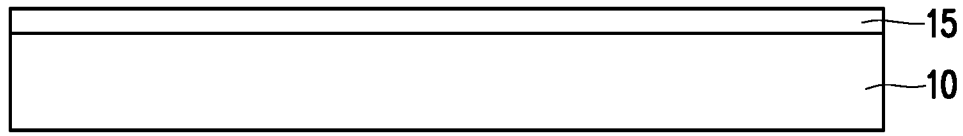
FIG. 5A shows one of the various stages of a manufacturing operation for an electronic device according to an embodiment of the present disclosure.

As shown in FIG. 5A, an insulating layer 15 is formed over a substrate 10, similar to FIG. 1A.

Figure 5B:
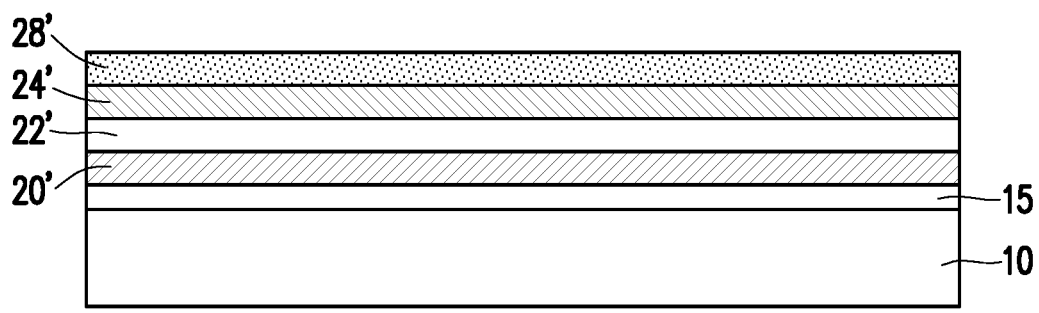
FIG. 5B shows one of the various stages of a manufacturing operation for an electronic device according to an embodiment of the present disclosure.

As shown in FIG. 5B, a first conductive layer 20' for the first electrode 20 is formed over the insulating layer 15, a dielectric layer 22' for the capacitor dielectric layer 22 is formed over the first conductive layer 20' and a second conductive layer 24' is formed over the dielectric layer 22', similar to FIG. 5B. Further, a barrier layer 28' is formed over the second conductive layer 24' as shown in FIG. 5B. The barrier layer 28' has a property of preventing hydrogen from penetrating into the capacitor dielectric layer.

In some embodiments, the barrier layer 28' includes one or more selected from the group consisting of silicon carbide, aluminum oxide, aluminum nitride, titanium nitride, titanium carbide, gold, titanium and tungsten. In some embodiments, the barrier layer 28' is made of a different material than the second conductive layer 24'.

The thickness of the barrier layer 28' is in a range from about 10 nm to about 5.0 µm, and is in a range from about 0.1 µm to 1.0 µm in other embodiments. The barrier layer 28' can be formed by chemical vapor deposition (CVD), atomic layer deposition (ALD), physical vapor deposition (PVD) including sputtering, or electroplating, or any other suitable film formation methods.

Figure 5C:
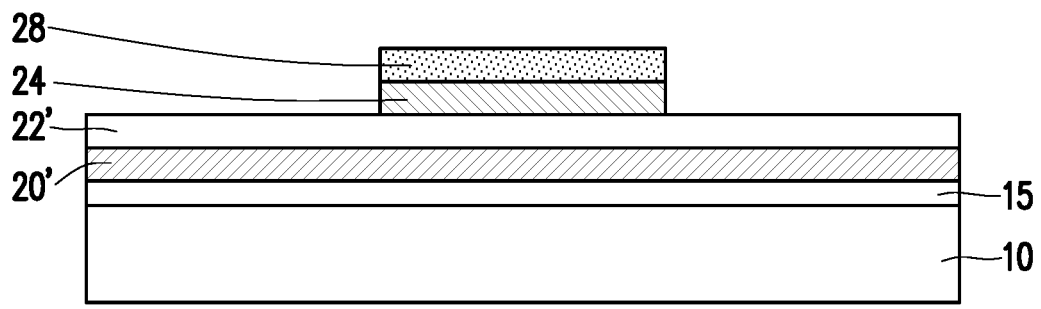
FIG. 5C shows one of the various stages of a manufacturing operation for an electronic device according to an embodiment of the present disclosure.

Then, as shown in FIG. 5C, the barrier layer 28' and the second conductive layer 24' are patterned, to obtain an electrode barrier layer 28 and the second electrode 24. In some embodiments, a photo resist pattern is formed on the barrier layer 28' and the barrier layer 28' is etched by dry and/or wet etching as the resist pattern as an etching mask. Then, by using the patterned barrier layer 28' as an etching mask, the second conductive layer 24' is patterned by dry and wet etching. In other words, the patterned barrier layer 28' is used as a hard mask for the etching of the second conductive layer 24'.

Figure 5D:
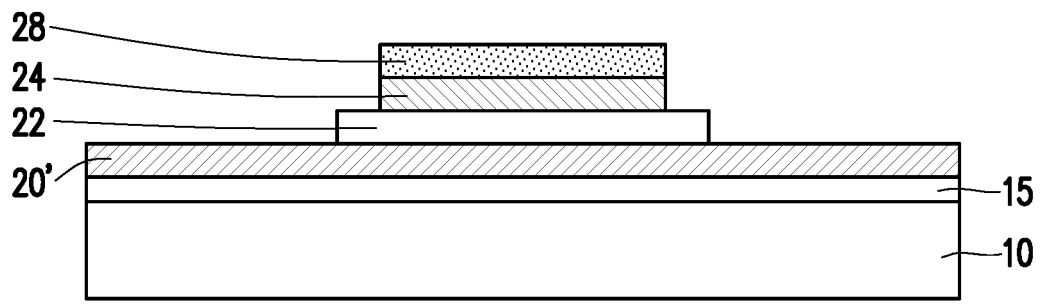
FIG. 5D shows one of the various stages of a manufacturing operation for an electronic device according to an embodiment of the present disclosure.

Further, as shown in FIG. 5D, the dielectric layer 22' is patterned to obtain the capacitor dielectric layer 22, by using one or more lithography and etching operations, similar to FIG. 1D.

Figure 5E:
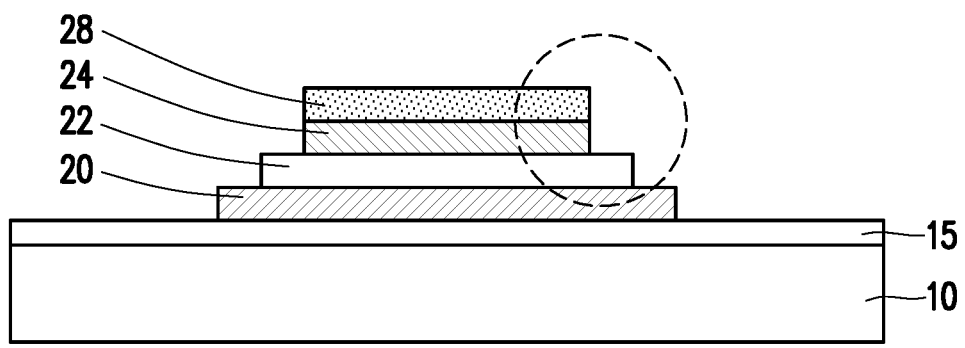
FIG. 5E shows one of the various stages of a manufacturing operation for an electronic device according to an embodiment of the present disclosure.

Then, as shown in FIG. 5E, the first conductive layer 20' is patterned to obtain the first electrode 20, by using one or more lithography and etching operations, similar to FIG. 1E.

Figure 5F:
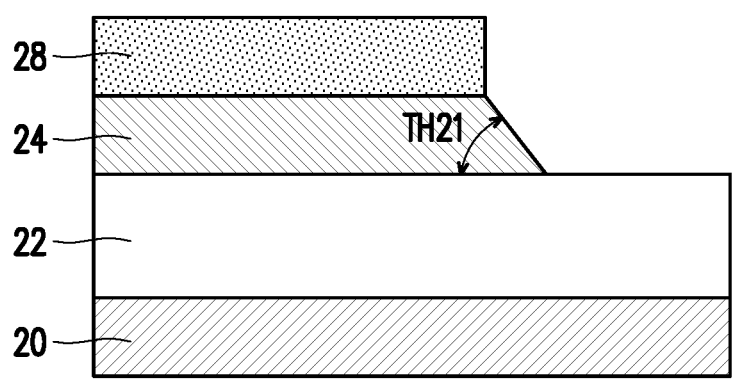
FIG. 5F shows an enlarged view of FIG. 5E.

As shown in FIG. 5F, which is an enlarged view of the circled portion of FIG. 5E, in some embodiments, the second electrode has a tapered shape. In some embodiments, the angle TH21 of the tapered shape is in a range from about 60° to about 90° and is in a range from about 70° to 85° in other embodiments.

Figure 5G:
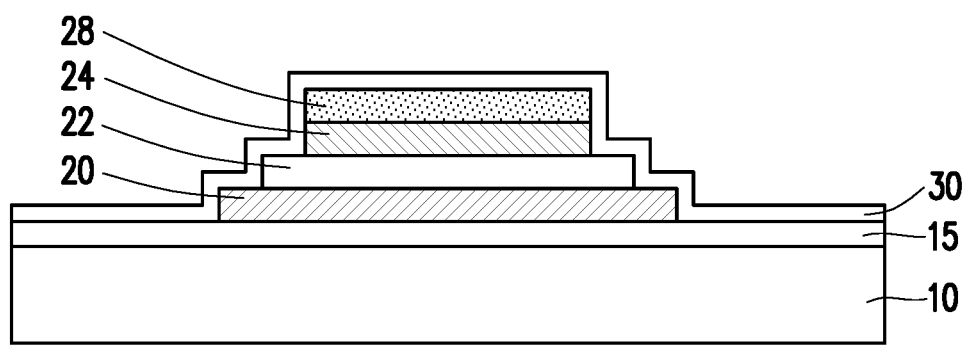
FIG. 5G shows one of the various stages of a manufacturing operation for an electronic device according to an embodiment of the present disclosure.

Subsequently, as shown in FIG. 5G, a passivation layer 30 is formed to cover the capacitor including the electrode barrier layer 28, the second electrode 24, the capacitor dielectric layer 22 and the first electrode 20, similar to FIG. 1F.

In the structure shown in FIG. 5G, due to the electrode barrier layer 28 that can prevent hydrogen from penetrating into the capacitor dielectric layer 22, it is possible to prevent peeling problems caused by hydrogen driven by bias voltage and dielectric breakdown at the edge of the second electrode 24. In addition, since the second conductive layer 24' is patterned by using a hard mask, the taper angle (TH21) can be close to 90°, which can also prevent dielectric breakdown at the edge of the second electrode 24.

FIGS. 6A-6D show various structures of electronic devices including a capacitor according to embodiments of the present disclosure. Materials, structures, configurations, dimensions and/or processes the same as or similar to the foregoing embodiments described with FIGS. 1A-5G may be employed in the following embodiments, and detailed explanation thereof may be omitted. Two or more of the foregoing embodiments shown by FIG. 1H, FIG. 2G, FIG. 3H, FIG. 4I and FIG. 5G can be combined.

Figure 6A:
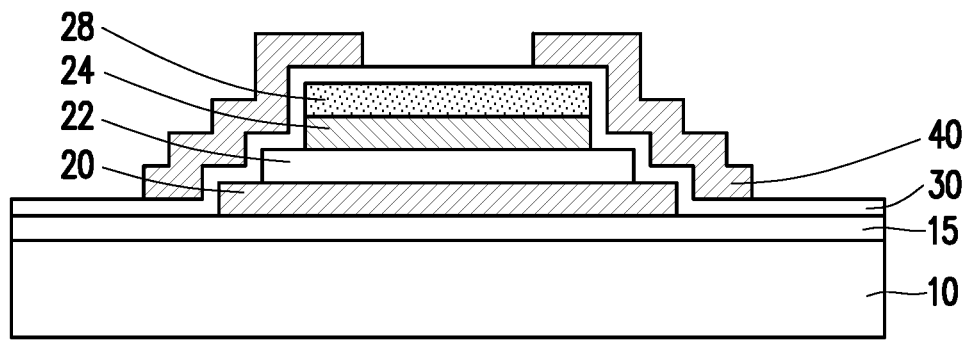
FIG. 6A shows a cross sectional view of an electronic device according to another embodiment of the present disclosure.

FIG. 6A shows an electronic device having the structure of FIG. 1H and FIG. 5G. The electrode barrier layer 28 is added to the structure of FIG. 1H.

Figure 6B:
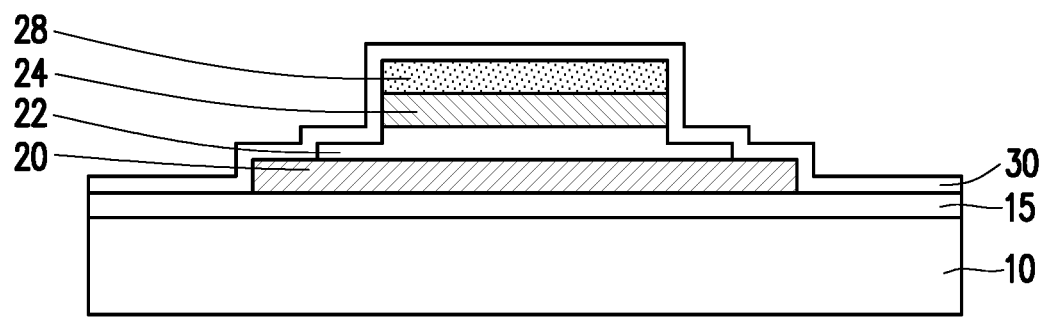
FIG. 6B shows a cross sectional view of an electronic device according to another embodiment of the present disclosure.

FIG. 6B shows an electronic device having the structure of FIG. 2G and FIG. 5G. The electrode barrier layer 28 is added to the structure of FIG. 2G.

Figure 6C:
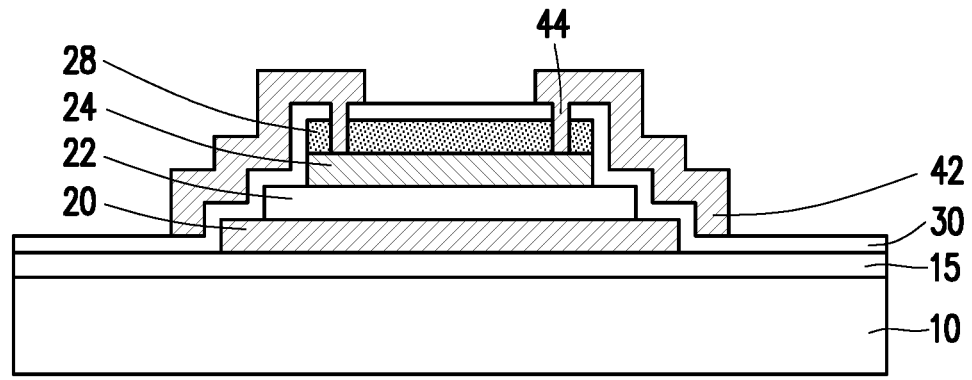
FIG. 6C shows a cross sectional view of an electronic device according to another embodiment of the present disclosure.

FIG. 6C shows an electronic device having the structure of FIG. 3H and FIG. 5G. The electrode barrier layer 28 is added to the structure of FIG. 3H.

Figure 6D:
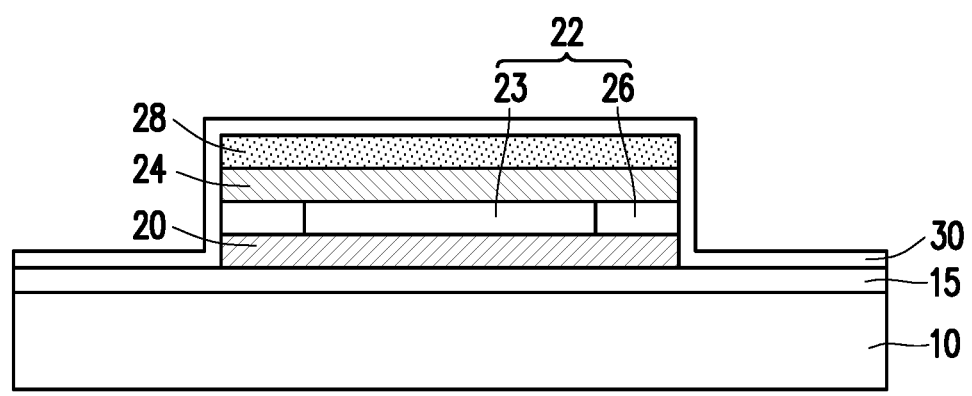
FIG. 6D shows a cross sectional view of an electronic device according to another embodiment of the present disclosure.

FIG. 6D shows an electronic device having the structure of FIG. 4I and FIG. 5G. The electrode barrier layer 28 is added to the structure of FIG. 4I.

Further, for example, but not limited to, the structures of FIGS. 1H, 2G and 5G can be combined, the structures of FIGS. 2G, 3H and 5G can be combined, the structures of FIGS. 1H and 4I (and 5G) can be combined, and the structures of FIGS. 3H and 4I (and 5G) can be combined.

Figure 7A:
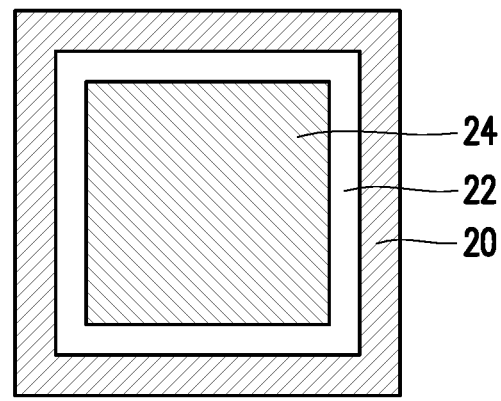
FIG. 7A shows a plan view of a capacitor according to an embodiment of the present disclosure.

FIGS. 7A-7E show various plan views of a capacitor according to embodiments of the present disclosure. The overall shape in plan view of the capacitor can have various shapes. As shown in FIG. 7A, the shape of the capacitor can be a square with or without rounded corners.

Figure 7B:
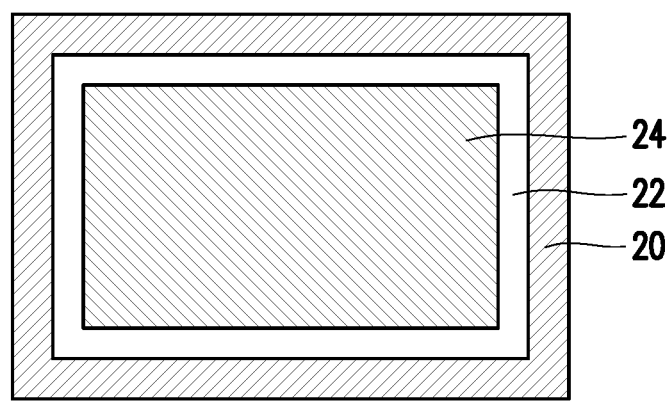
FIG. 7B shows a plan view of a capacitor according to an embodiment of the present disclosure.
Figure 7C:
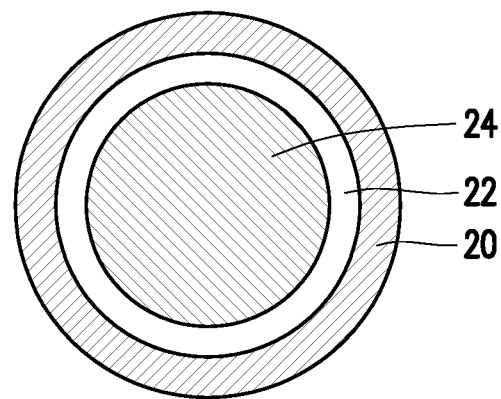
FIG. 7C shows a plan view of a capacitor according to an embodiment of the present disclosure.
Figure 7D:
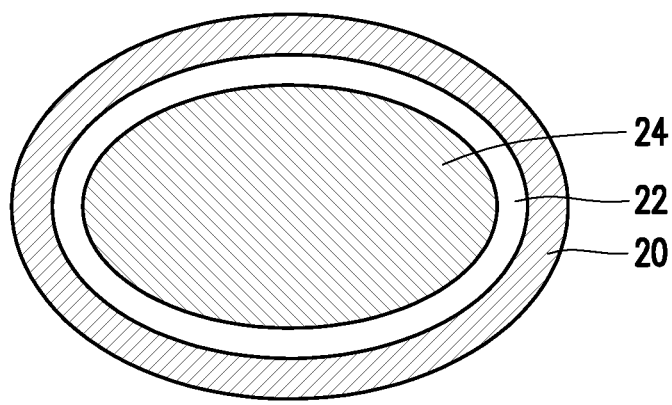
FIG. 7D shows a plan view of a capacitor according to an embodiment of the present disclosure.
Figure 7E:
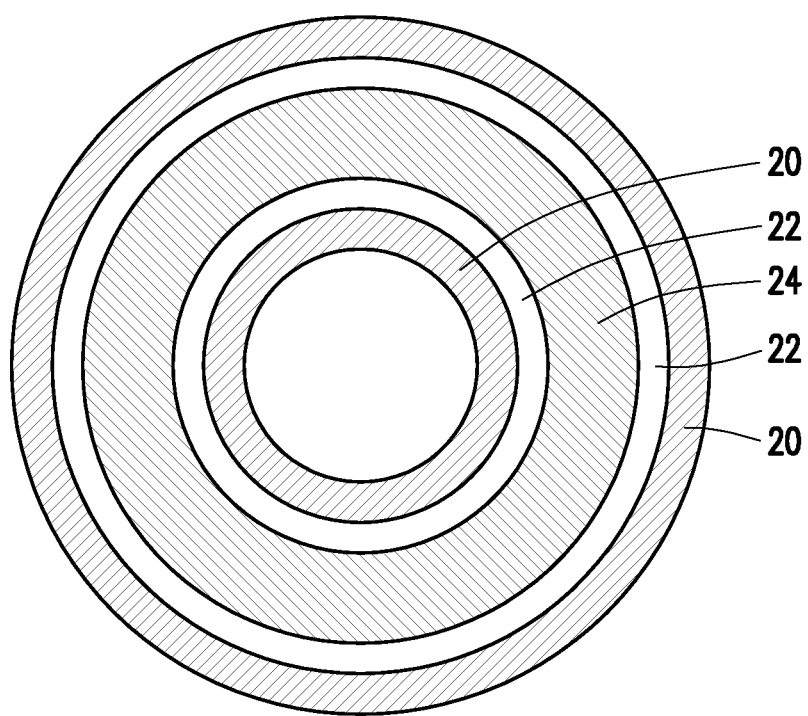
FIG. 7E shows a plan view of a capacitor according to an embodiment of the present disclosure.

In FIG. 7B, the shape of the capacitor is a rectangular (not square) with or without rounded corners. In FIG. 7C, the shape of the capacitor is a circular, and in FIG. 7D, the shape of the capacitor is an oval (not circle). In other embodiments, as shown in FIG. 7E, the shape of the capacitor is a doughnut (circular/oval) or a frame shape (square/rectangular), having an opening at the center portion.

The area (size) of the capacitor (the area of the second electrode) is in a range from about 0.01 $\mu m^2$ to about 100 $mm^2$ in some embodiments, and is in a range from about 1 $\mu m^2$ to about 1 $mm^2$ in other embodiments.

Figure 8A:
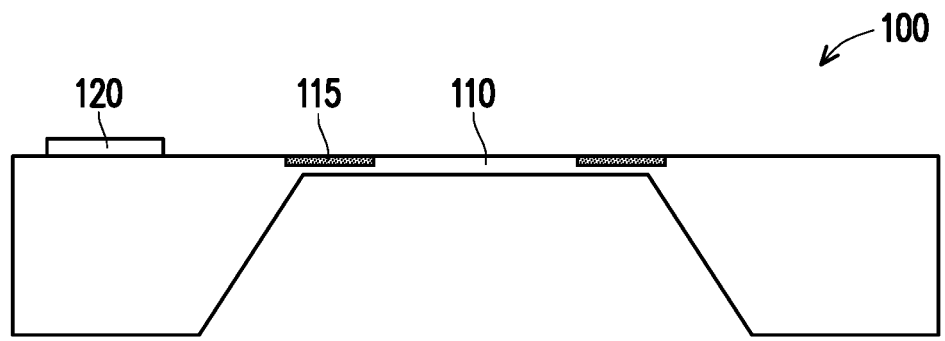
FIG. 8A shows a cross sectional view of a piezo electric device according to an embodiment of the present disclosure.
Figure 8B:
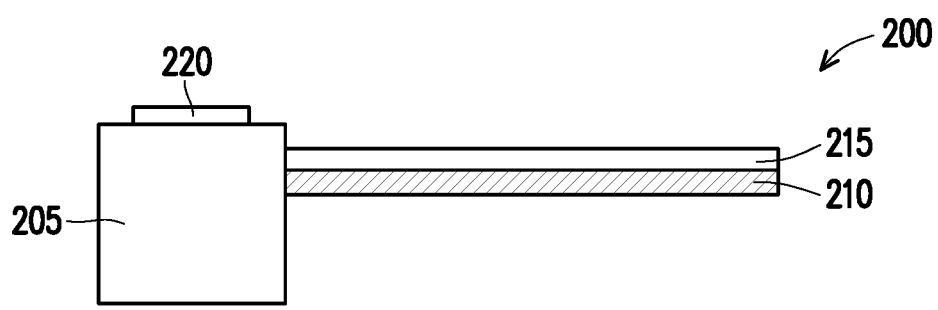
FIG. 8B shows a cross sectional view of a piezo electric device according to another embodiment of the present disclosure.

FIGS. 8A and 8B show applications of the electronic device as set forth above.

FIG. 8A shows a cross sectional view of a piezo electric device according to an embodiment of the present disclosure. As shown in FIG. 8A, a piezo electric device 100 is a MEMS sensor, such as a pressure sensor or a speaker/microphone, having a membrane 110 and a piezo element 115. Further, a capacitor 120 according to one or more of the foregoing embodiments is provided on the piezo electric device 100, and electrically coupled to other portions of the piezo electric device 100.

FIG. 8B shows a cross sectional view of a piezo electric device according to another embodiment of the present disclosure. As shown in FIG. 8B, a piezo electric device 200 is a piezo actuator, having a substrate membrane 210 and a piezo membrane 215. Further, a capacitor 220 according to one or more of the foregoing embodiments is provided on the piezo electric device 200, and electrically coupled to other portions of the piezo electric device 200.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with one aspect of the present disclosure, an electronic device includes a capacitor and a passivation layer covering the capacitor. The capacitor includes a first electrode, a dielectric layer disposed over the first electrode and a second electrode disposed over the dielectric layer. An area of the first electrode is greater than an area of the dielectric layer, and the area of the dielectric layer is greater than an area of the second electrode so that a side of the capacitor has a multi-step structure. In one or more of the foregoing and following embodiments, the capacitor further includes a barrier layer disposed over the second electrode, and the barrier layer prevents hydrogen from penetrating into the dielectric layer. In one or more of the foregoing and following embodiments, the barrier layer includes one or more selected from the group consisting of silicon carbide, aluminum oxide, aluminum nitride, titanium nitride, titanium carbide, gold, titanium and tungsten. In one or more of the foregoing and following embodiments, a material of the barrier layer is different from a material of the passivation layer. In one or more of the foregoing and following embodiments, a side face of the second electrode has a tapered shape, and an angle of the tapered shape is in a range from 60° to 90°. In one or more of the foregoing and following embodiments, a side face of the dielectric layer has one or more steps. In one or more of the foregoing and following embodiments, an uppermost step of the one or more steps has a tapered shape, and an angle of the tapered shape is in a range from 60° to 90°. In one or more of the foregoing and following embodiments, a lowermost step of the one or more steps has a tapered shape, and an angle of the tapered shape is in a range from 10° to 50°. In one or more of the foregoing and following embodiments, the side face of the dielectric layer has one step so that the side face has a lower part and an upper part, and a height of the lower part greater than a height of the upper part. In one or more of the foregoing and following embodiments, the electronic device further includes a conductive layer disposed over the passivation layer, and the conductive layer is electrically floating. In one or more of the foregoing and following embodiments, the conductive layer covers at least the side of the capacitor having the multi-step structure and an edge part of the second electrode, and does not cover a part of the passivation layer disposed above the second electrode. In one or more of the foregoing and following embodiments, the conductive layer fully covers the capacitor. In one or more of the foregoing and following embodiments, the electronic device further includes a conductive layer disposed over the passivation layer, and the conductive layer is connected to the second electrode via a conductive connector. In one or more of the foregoing and following embodiments, the conductive layer covers at least the side of the capacitor having the multi-step structure and an edge part of the second electrode and does not cover a part of the passivation layer disposed above the second electrode. In one or more of the foregoing and following embodiments, the dielectric layer includes a ferroelectric dielectric material. In one or more of the foregoing and following embodiments, the dielectric layer includes one or more selected from the group consisting of silicon oxide, silicon nitride, aluminum oxide and aluminum nitride. In one or more of the foregoing and following embodiments, a thickness of the dielectric layer is in a range from 0.2 µm to 2.0 µm. In one or more of the foregoing and following embodiments, the passivation layer includes one or more selected from the group consisting of silicon nitride, silicon oxide and aluminum oxide. In one or more of the foregoing and following embodiments, a thickness of the passivation layer is in a range from 0.02 µm to 2.0 µm. In one or more of the foregoing and following embodiments, the electronic device further includes a substrate and an insulating layer disposed over the substrate. The electronic device is disposed on the insulating layer. In one or more of the foregoing and following embodiments, a thickness of the barrier layer is in a range from 0.01 µm to 5.0 µm.

In accordance with another aspect of the present disclosure, a device includes a piezo-electric device and the electronic device according to one or more of the foregoing and following embodiments provided on the piezo-electric device. In one or more of the foregoing and following embodiments, the piezo-electric device is a micro electro mechanical system (MEMS) sensor. In one or more of the foregoing and following embodiments, the piezo-electric device is a piezo-actuator.

In accordance with another aspect of the present disclosure, an electronic device includes a capacitor and a passivation layer covering the capacitor. The capacitor includes a first electrode, a dielectric layer disposed over the first electrode, and a second electrode disposed over the dielectric layer. The dielectric layer includes a first dielectric part and a second dielectric part surrounding the first dielectric part in plan view, and a breakdown voltage of a material of the second dielectric part is higher than a breakdown voltage of a material of the first dielectric part. In one or more of the foregoing and following embodiments, the material of the second dielectric part is one elected from the group consisting of silicon oxide, lead zirconate titanate, and aluminum nitride, and the material of the first dielectric part is one elected from the group consisting of silicon oxide, lead zirconate titanate, aluminum nitride, silicon nitride, titanium oxide, amorphous carbon and polycrystalline diamond.

In accordance with another aspect of the present disclosure, in a method of manufacturing an electronic device, a first conductive layer is formed over a substrate. A first dielectric layer is formed over the first conductive layer. The first dielectric layer is patterned. A second dielectric layer is formed over the patterned first dielectric layer. A part of the second dielectric layer above the patterned first dielectric layer is removed. A second conductive layer is formed over the second dielectric layer and the patterned first dielectric layer. The second conductive layer, the second dielectric layer and the first conductive layer are patterned to form a capacitor. A passivation layer covering the capacitor is formed. A breakdown voltage of a material of the second dielectric layer is higher than a breakdown voltage of a material of the first dielectric layer.

In accordance with another aspect of the present disclosure, in a method of manufacturing an electronic device, a first conductive layer is formed over a substrate. A dielectric layer is formed over the first conductive layer. A second conductive layer is formed over the dielectric layer. The second conductive layer is patterned. The dielectric layer is patterned by using the patterned second conductive layer as an etching mask. The dielectric layer is patterned. The first conductive layer is patterned, to form a capacitor. A passivation layer covering the capacitor is formed. In the patterning of the second conductive layer, a part of the dielectric layer is removed such that a side face of the dielectric layer has a step after the dielectric layer is patterned.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
    a capacitor including:
        a first electrode;
        a dielectric layer disposed over the first electrode;
        a second electrode disposed over the dielectric layer; and
        a barrier layer disposed over the second electrode; and
    a passivation layer covering the capacitor such that the passivation layer is in contact with side faces of the first electrode, the dielectric layer, the second electrode and the barrier layer, wherein:
    an area of the first electrode is greater than an area of the dielectric layer, and the area of the dielectric layer is greater than an area of the second electrode so that a side of the capacitor has a multi-step structure,
    each of side faces of the dielectric layer has a first tapered surface, a flat surface and a second tapered surface located at a higher level than the first tapered surface,
    the flat surface is disposed between the first tapered surface and the second tapered surface, and
    the passivation layer is in contact with the first tapered surface, the flat surface and the second tapered surface.

2. The electronic device of claim 1, wherein the barrier layer includes one or more selected from the group consisting of silicon carbide, aluminum oxide, aluminum nitride, titanium nitride, titanium carbide, gold, titanium and tungsten.

3. The electronic device of claim 1, wherein a material of the barrier layer is different from a material of the passivation layer.

4. The electronic device of claim 1, wherein an angle of the second tapered surface is in a range from 60° to 90°.

5. The electronic device of claim 1, wherein an angle of the first tapered surface is in a range from 10° to 50°.

6. The electronic device of claim 1, wherein:
    a height of the first tapered surface is greater than a height of the second tapered surface.

7. The electronic device of claim 1, wherein:
    the electronic device further includes a conductive layer disposed over the passivation layer, and
    the conductive layer is connected to the second electrode via a conductive connector.

8. The electronic device of claim 1, wherein a thickness of the dielectric layer is in a range from 0.2 μm to 2.0 μm.

9. A device comprising:
a piezo-electric device; and
the electronic device according to claim 1 provided on the piezo-electric device.

10. The electronic device of claim 1, wherein:
the electronic device further includes a conductive layer disposed over and in contact with the passivation layer, and
the conductive layer continuously covers the multi-step structure of the side of the capacitor from a side of the first electrode to a side of the barrier layer with interposing the passivation layer between the conductive layer and the multi-step structure.

11. An electronic device, comprising:
a capacitor including:
a first electrode;
a dielectric layer disposed over the first electrode; and
a second electrode disposed over the dielectric layer;
a passivation layer covering the capacitor; and
a conductive layer disposed over the passivation layer,
the conductive layer is electrically floating,
an area of the first electrode is greater than an area of the dielectric layer, and the area of the dielectric layer is greater than an area of the second electrode so that a side of the capacitor has a multi-step structure.

12. The electronic device of claim 11, wherein the conductive layer covers at least the side of the capacitor having the multi-step structure and an edge part of the second electrode, and does not cover a part of the passivation layer disposed above the second electrode.

13. The electronic device of claim 11, wherein the conductive layer fully covers the capacitor.

14. The electronic device of claim 11, wherein the dielectric layer includes a ferroelectric dielectric material.

15. The electronic device of claim 11, wherein the dielectric layer includes one or more selected from the group consisting of silicon oxide, silicon nitride, aluminum oxide and aluminum nitride.

16. An electronic device, comprising:
a capacitor including:
a first electrode;
a dielectric layer disposed over the first electrode;
a second electrode disposed over the dielectric layer; and
a barrier layer disposed over the second electrode;
a passivation layer covering the capacitor such that the passivation layer is in contact with side faces of the first electrode, the dielectric layer, the second electrode and the barrier layer; and
a conductive layer disposed over and in contact with the passivation layer, and
wherein an area of the first electrode is greater than an area of the dielectric layer, and the area of the dielectric layer is greater than an area of the second electrode so that a side of the capacitor has a multi-step structure, and
the conductive layer continuously covers the multi-step structure of the side of the capacitor from a side of the first electrode to a side of the barrier layer with interposing the passivation layer between the conductive layer and the multi-step structure.

17. The electronic device of claim 16, wherein a side face of the second electrode has a tapered shape, and an angle of the tapered shape is in a range from 60° to 90°.

18. The electronic device of claim 16, wherein a material of the barrier layer is different from a material of the passivation layer.

19. The electronic device of claim 16, wherein the barrier layer includes one or more selected from the group consisting of silicon carbide, aluminum nitride, titanium carbide, gold, and tungsten.

* * * * *